United States Patent [19]

Andrews

[11] Patent Number: 4,631,636
[45] Date of Patent: Dec. 23, 1986

[54] HIGH DENSITY PACKAGING TECHNIQUE FOR ELECTRONIC SYSTEMS

[75] Inventor: D. Marshall Andrews, Satellite Beach, Fla.

[73] Assignee: Harris Corporation, Melbourne, Fla.

[21] Appl. No.: 593,516

[22] Filed: Mar. 26, 1984

[51] Int. Cl.[4] .............................................. H05K 7/20
[52] U.S. Cl. ..................... 361/385; 357/82; 361/382
[58] Field of Search ............... 357/76, 82, 81; 361/382, 383, 385–387, 401, 412, 414; 165/80.3, 80.4; 174/15 HP

[56] References Cited

U.S. PATENT DOCUMENTS

| | | |
|---|---|---|
| 3,143,592 | 8/1964 | August . |
| 3,191,100 | 6/1965 | Sorvillo . |
| 3,249,818 | 5/1966 | Hwang et al. . |
| 3,348,101 | 10/1967 | Klein et al. .......................... 361/412 |
| 3,411,041 | 11/1968 | Block . |
| 3,475,657 | 10/1969 | Knowles . |
| 3,899,720 | 8/1975 | Peterson . |
| 4,019,098 | 4/1977 | McCready et al. . |
| 4,118,756 | 10/1978 | Nelson et al. . |
| 4,120,019 | 10/1978 | Arii et al. . |
| 4,143,508 | 3/1979 | Ohno . |
| 4,186,422 | 7/1980 | Laermer ............................... 361/387 |
| 4,190,098 | 2/1980 | Hanlon . |
| 4,327,399 | 4/1982 | Sasaki et al. . |
| 4,402,135 | 9/1983 | Schweingruber et al. . |

FOREIGN PATENT DOCUMENTS 0795886 10/1968 Canada ............................... 361/385

OTHER PUBLICATIONS

Kerjilian et al, "Heat-Pipe Cooled Stacked Electronic Wafer Package", IBM Technical Disclosure Bulletin, vol. 18, No. 12, 5/76, pp. 3982-3983.

Primary Examiner—G. P. Tolin
Assistant Examiner—Greg D. Thompson
Attorney, Agent, or Firm—Barnes & Thornburg

[57] ABSTRACT

A high density packaging arrangement for electronics systems wherein a plurality of circuit board assemblies are provided with electronic components on one side and cooling tubes on the other side. The assemblies are arranged such that the cooling tubes mounted on one board cool the electronic components mounted on an adjacent board. Electronic contact elements are provided on the circuit board surfaces, to allow electrical interconnection of the electronic components mounted on adjacent boards.

26 Claims, 3 Drawing Figures

HIGH DENSITY PACKAGING TECHNIQUE FOR ELECTRONIC SYSTEMS

BACKGROUND AND SUMMARY OF THE INVENTION

This invention relates to a high density packaging technique for electronics systems.

With the continuing increase in size and sophistication of electronic systems, such as large scale digital computers, the efficient cooling of densely packaged electronic components remains a very important design consideration. Recognition of the importance of this consideration has spurred development of several alternative techniques and approaches to the problems involved. For example, U.S. Pat. No. 4,019,098 shows a system for removing heat from integrated circuit modules which includes the use of heat pipes formed in a layered aluminum heat transfer structure which is mounted between a circuit board and the integrated circuit modules to be cooled. A similar approach using heat pipe technology is shown in U.S. Pat. No. 4,118,756. Other approaches to this problem are shown in U.S. Pat. Nos. 3,411,041, which describes a heat exchanger package designed to cool a number of circuit modules, and 4,327,399, which shows a heat pipe structure formed in a silicon or ceramic substrate upon which integrated circuit elements are mounted.

The continuing development of structures such as those described in these patents demonstrates the existence of a need for novel high density, thermally efficient packaging techniques. In particular, there exists a need for a high density packaging system which provides increases in space and thermal and manufacturing efficiencies, while permitting the use of conventional component and circuit board fabricating techniques.

Accordingly, an object of the present invention is to provide a high density packaging arrangement for electronic systems which is highly efficient with regard to component density and heat transfer characteristics, and which utilizes conventional manufacturing techniques and components.

The present invention comprises a plurality of circuit board assemblies, each having electrical components mounted on one side and cooling elements mounted on the other side, arranged such that the electronic components mounted on a first circuit board are in heat conductive contact with the cooling elements mounted on a second circuit board. The present invention further comprises an electronic component which comprises an electronic device encapsulated in a thermoplastic resin. A particularly advantageous embodiment of such a component for use with the present invention includes a high thermal conductivity element (i.e., an element whose thermal conductivity is high relative to the thermoplastic resin) partially encapsulated and held in place by the thermoplastic material, but having an exposed portion or surface for contacting the cooling elements of an adjacent board. This element is preferably made of metal and is preferably positioned on the electronic device in the mold prior to injecting the thermoplastic resin.

A particularly advantageous embodiment of the present invention results when the electronic components are mounted in recesses formed on one side of the circuit board and the cooling elements are mounted in channels formed on the other side of the circuit board. By so forming the circuit boards, electrical interconnection of the electronic components mounted on different boards is possible. This is accomplished by mounting conductive elements on the ridge areas formed between the recesses and channels, such that contact is established between conductive elements on adjacent boards when the packaging arrangement is assembled. This structure allows the electronic components mounted on different circuit boards to be electrically interconnected, while minimizing signal path and delay time and improving overall system performance.

Other aspects of the present invention include: the use of a removable support or clamping device such that the assembly can be readily disassembled for repair or replacement of defective parts; the use of compliant conductive elements, such as a conductive rubber contact element, for the mounting on the ridge areas of the boards; the placement of a resilient element, such as a rubber pad, between the electronic component and the circuit board to bias or push the electronic component toward the cooling element mounted on the adjacent board; and use of liquid or gaseous coolant in the coolant elements or tubes.

BRIEF DESCRIPTION OF THE DRAWINGS

For a better understanding of the present invention, reference is made to the following detailed description of a preferred embodiment and the accompanying figures in which.

DETAILED DESCRIPTION OF THE DRAWINGS

Figure 1:
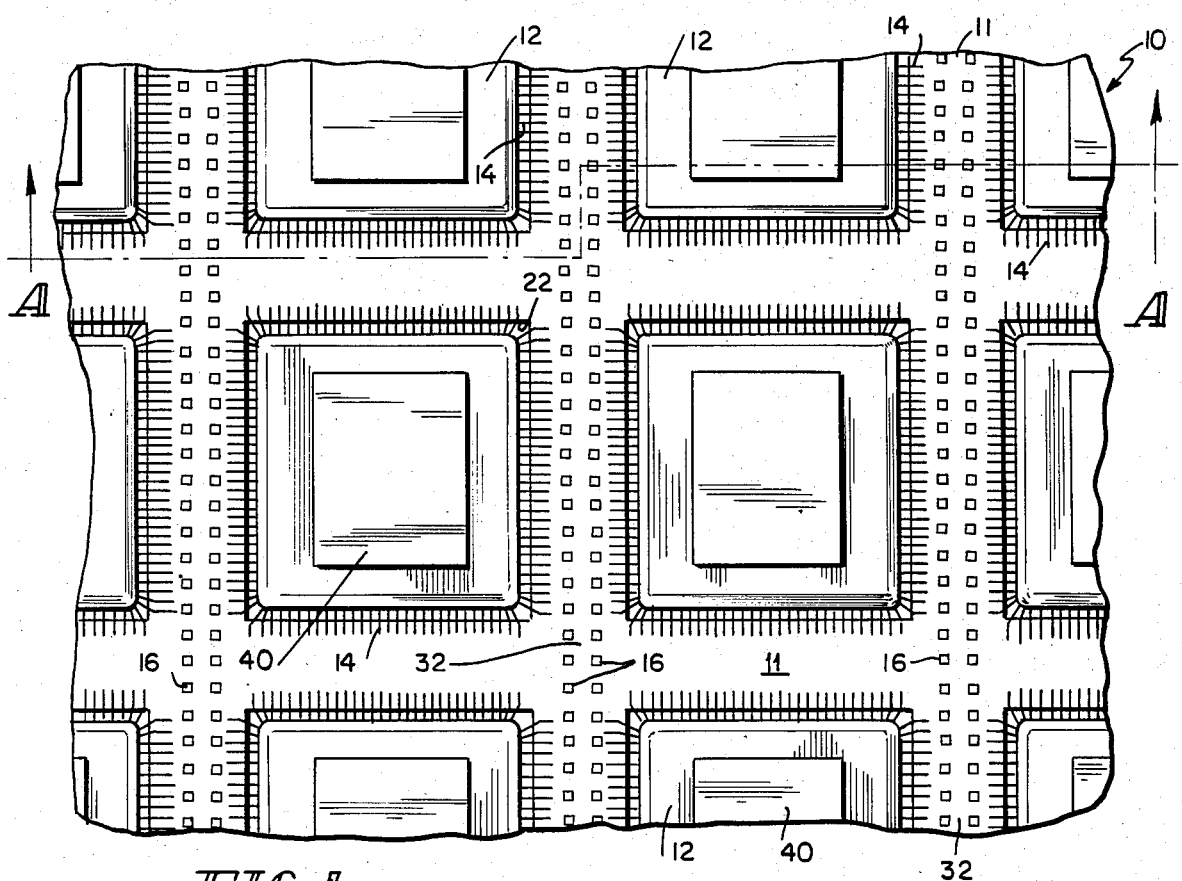
FIG. 1 is a top view of a preferred embodiment of the high density packaging arrangement.

FIG. 1 shows a view of a portion of one of the circuit board assemblies 10 making up this preferred embodiment of a high density packaging arrangement. Visible in FIG. 1 are printed circuit board 11, electronic components 12 having lead portions 14, and conductive elements 16 mounted on the surface of board 11. These features will be discussed in greater detail, along with other aspects of the preferred embodiment, with reference to FIG. 2 which shows a cross-section of the preferred embodiment along section line A—A of FIG. 1.

Figure 2:
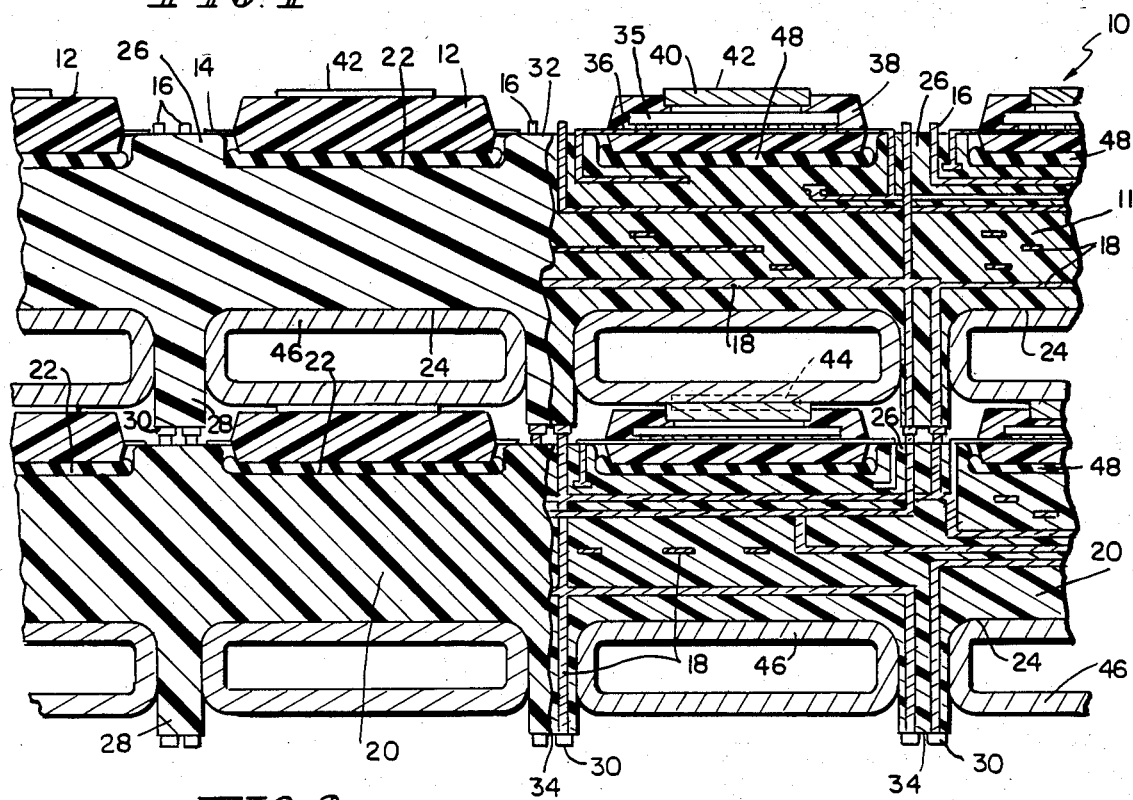
FIG. 2 is a cross-section taken along section line A—A of the preferred embodiment shown in FIG. 1.

Shown in FIG. 2 are printed circuit boards 11 and 20 arranged in accordance with the present invention. These circuit boards are preferably made according to conventional printed circuit board techniques and are provided with conductive portions printed on, or embedded in, the board. Representative conductive portions are denoted by reference numeral 18 in FIG. 2.

Although a high density packaging arrangement can be achieved, according to a first aspect of this invention, through the use of circuit board assemblies having generally flat surfaces on either side, the particularly advantageous embodiment shown in FIG. 2 provides for the formation of recesses 22 on one side and for the formation of channels 24 on the other side of circuit boards 11 and 20. Formation of recesses 22 and channels 24 produce, respectively, ridge areas 26 and 28 on the board surfaces. The depth and spacing of these recesses and channels can be selected so as to allow ridge areas 26 and 28 on adjacent boards to abut. Conductive contact elements 16 and 30 (described in more detail below) are mounted on surfaces 32 and 34 of ridge areas 26 and 28, respectively, to provide for electrical interconnection between the electronic components mounted on boards 11 and 20.

It should be apparent that this feature could be achieved through the use of channels or recesses (rather than both) by simply increasing the depth of whichever is selected so as to allow a conductive element mounted on the created ridge area to contact a conducting element mounted on the surface of an adjacent board. These alternative embodiments may be preferred when the mounting arrangement of the present invention is used with electronic components and cooling elements which vary in design or configuration from those described in this particular embodiment. However, for the particular components and elements described below, the use of both recesses and channels is especially preferred.

Conductive elements 16 and conductive elements 30 are preferably compliant conductive elements. As used herein, the term compliant conductive element means an element which is compressible under a moderate load, such as a conductive rubber contact element. Use of compliant elements on both board assemblies assures that good electrical contact will be established between opposing contact elements without concern for precision tolerances which would otherwise be required to assure contact between a multiplicity of relatively rigid contact elements. The compliant conductive elements can be mounted (for example, by use of a conductive epoxy) to exposed conductive portions 18 on the printed circuit board. Electrical interconnection of selected conductive elements 16 and 30 with other conductive elements or with selected conductive portions 18 allows for electrical interconnection between any of the electronic components mounted on any of the boards in the packaging arrangement.

Electronic components 12 are mounted in recesses 22. Components 12 are produced by conventional techniques in which die element 35 is attached to lead carrying film or tape 36. This assembly is placed into a mold and an encapsulating material 38, such as a thermoplastic synthetic resin, is injected. An especially preferred embodiment of electronic component 12 is further provided with high thermal conductivity element 40, which is placed in the mold prior to encapsulation of the electronic device. Element 40, which is preferably a metal disk or pad, has an exposed surface 42 which protrudes slightly above the encapsulating material. As shown generally at 44, exposed surface 42 of high thermal conductivity element 40 preferably contacts cooling tube 46, mounted on an adjacent board, enhancing the heat transfer efficiency of the assembly.

Lead portions 14 of electronic components 12 are attached to conductive portions 18 of the printed circuit boards by known techniques, such as soldering, thermal compression or conductive epoxy. A particularly advantageous feature related to the mounting of electronic components 12 is the provision of resilient element 48 positioned between electronic component 12 and board 11 or 20. This resilient element, which is preferably a pad of rubber or other compressible material, is provided to bias or push electronic component 12 toward the cooling element mounted on the adjacent board. This function is much the same as that served by compliant conductive elements 16 and 30, i.e., resilient element 48 assures good thermal contact between surface 42 and cooling tubes 46 when adjacent boards are arranged as shown in FIG. 2. This result is achieved without reliance on the precision tolerances which would otherwise be necessary to assure contact, or close proximity, between a multiplicity of cooling elements and electronic components. This would also compensate for manufacturing tolerances of the individual components and boards.

Figure 3:
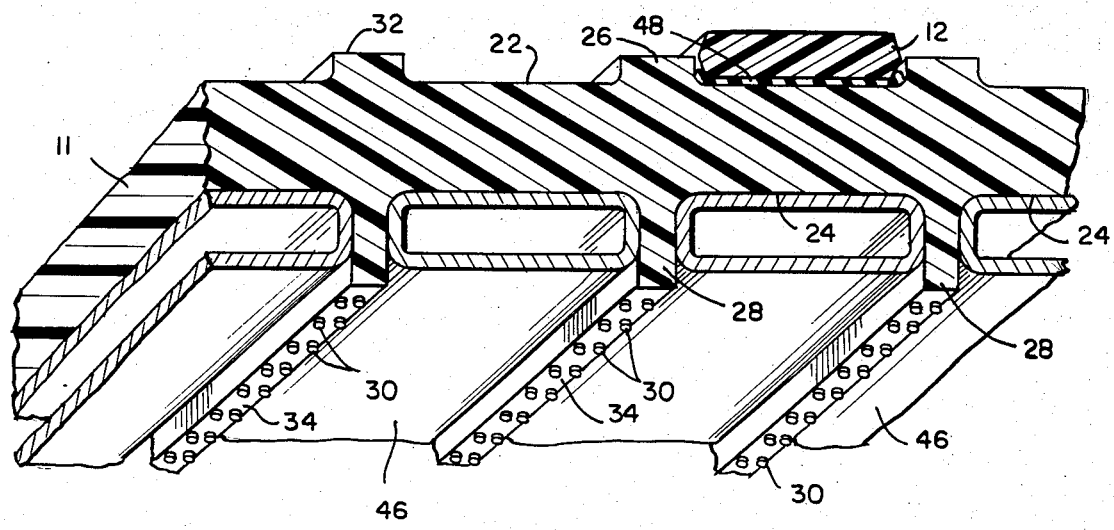
FIG. 3 is a partial perspective of a single circuit board assembly.

Cooling tubes 46 are mounted in channels 24 of boards 11 and 20. In the preferred embodiment pictured in FIG. 2, cooling tubes 46 are preferably retained in channels 24 by adhesives or suitable mechanical fasteners. However, for alternative configurations which permit the use of a more flexible circuit board, cooling tubes 46 are preferably wedged into channels 24 without the use of adhesives or fasteners. The rectangular cross-section of cooling tubes 46, as shown in FIGS. 2 and 3, is preferred for reasons relating to manufacturing ease and thermal efficiency. This cross-section permits establishment of a large heat transfer contact area between tube 46 and component 12, as shown in area 44 in FIG. 2, and between the tube and circuit board to which it is mounted.

An especially preferred coolant for this particular embodiment is water. Other preferred coolants which may be advantageous in particular applications are refrigerants, such as freon, or a high thermal conductivity gas, such as helium.

A plurality of circuit board assemblies 10 may be clamped together by any suitable support or clamping means (not shown) to produce a three-dimensional array of cooled electronic components 12. The support or clamping means exerts a compressive force on the circuit board assemblies to assure compression of the compliant conductive elements 16 and 30 and the resilient elements 48, as discussed above. The clamping means is preferably removable so as to allow for easy disassembly of the arrangement for removal and replacement of defective parts and components.

FIG. 3 is a partial perspective view of a single circuit board assembly which more clearly shows cooling tubes 46 mounted in channels 24.

The invention has been discussed in terms of a preferred embodiment wherein a plurality of circuit board assemblies are arranged so as to provide a three-dimensional array of electronic components and wherein the components mounted on one board are cooled by a cooling tube mounted on an adjacent board. It should be understood, however, that the scope of the invention is not intended to be limited to the preferred embodiment discussed.

What is claimed is:

1. A high density packaging arrangement for electronics systems, comprising:
   a first circuit board assembly, comprising an insulating circuit board having a plurality of electronic components mounted on a first side thereof and having conductor means interconnecting said electronic components, and having cooling means, mounted on a second side thereof, for passage of a coolant; and
   a second circuit board assembly, comprising an insulating circuit board having cooling means, mounted on a second side thereof, for passage of a coolant;
   wherein said first and second circuit board assemblies are arranged such that said cooling means mounted on said second circuit board assembly is in heat conductive contact with at least one of said plurality of electronic components mounted on said first circuit board assembly.

2. A high density packaging arrangement for electronics systems according to claim 1, wherein said second circuit board assembly further comprises a plurality of electronic components mounted on a first side of said insulating circuit board; and conductor means interconnecting said electronic components.

3. A high density packaging arrangement for electronics systems according to claim 1, wherein at least one of said plurality of electronic components comprises an electronic device encapsulated in a thermoplastic material, except for lead portions thereof, and high thermal conductivity means, partially encapsulated in said thermoplastic material and having an exposed portion on a top surface of said electronic component, in thermal contact with said cooling means.

4. A high density packaging arrangement for electronics systems according to claim 1, wherein said cooling means comprises a plurality of cooling tubes.

5. A high density packaging arrangement for electronics systems according to claim 4, wherein at least one of said plurality of cooling tubes has a generally rectangular cross-section.

6. A high density packaging arrangement for electronics systems according to claim 2, wherein said electronic components are mounted in a plurality of recesses formed on said first sides of said insulating circuit boards.

7. A high density packaging arrangement for electronics systems according to claim 6, wherein said first circuit board assembly further comprises a plurality of first conductive means, mounted on said first side between said recesses, and wherein said second circuit board assembly further comprises a plurality of second conductive means mounted on said second side, providing electrical interconnections between said electronic components.

8. A high density packaging arrangement for electronics systems according to claim 7, wherein at least one of said plurality of first conductive means mounted on said first side is a compliant conductive element.

9. A high density packaging arrangement for electronics systems according to claim 7, wherein at least one of said plurality of second conductive means mounted on said second side is a compliant conductive element.

10. A high density packaging arrangement for electronics systems according to claim 2, wherein said cooling means are mounted in a plurality of channels formed on said second sides of said insulating circuit boards.

11. A high density packaging arrangement for electronics systems according to claim 10, wherein said first circuit board assembly further comprises a plurality of first conductive means, mounted on said first side between said electronic components, and wherein said second circuit board assembly further comprises a plurality of second conductive means mounted on said second side between said channels, providing electrical interconnections between said electronic components.

12. A high density packaging arrangement for electronics systems according to claim 11, wherein at least one of said plurality of first conductive means mounted on said first side is a compliant conductive element.

13. A high density packaging arrangement for electronics systems according to claim 11, wherein at least one of said plurality of second conductive means mounted on said second side is a compliant conductive element.

14. A high density packaging arrangement for electronics systems according to claim 1, wherein said first circuit board assembly further comprises resilient means, positioned between at least one of said plurality of electronic components and said first side, biasing said electronic component toward said cooling means.

15. A high density packaging arrangement for electronics systems, comprising:
   a plurality of circuit board assemblies, each circuit board assembly comprising:
      an insulating circuit board having a plurality of recesses formed on a first side thereof, and having a plurality of channels formed on a second side thereof;
      a plurality of electronics components mounted in said recesses;
      conductor means electrically interconnecting said electronic components; and
      cooling means, mounted in said channels, for passage of a coolant;
   wherein a first and a second of said plurality of circuit board assemblies are arranged such that said cooling means of said second circuit board assembly is in heat conductive contact with at least one of said plurality of electronic components mounted in said recesses on said first side of said first circuit board assembly.

16. A high density packaging arrangement for electronics systems according to claim 15, wherein said each circuit board assembly further comprises a plurality of first conductive means, mounted on said first side between said recesses, and a plurality of second conductive means, mounted on said second side between said channels, providing electrical interconnections between said electronic components mounted on said circuit board assemblies.

17. A high density packaging arrangement for electronics systems according to claim 16, wherein at least one of said plurality of first conductive means mounted on said first side is a compliant conductive element.

18. A high density packaging arrangement for electronics systems according to claim 16, wherein at least one of said plurality of second conductive means mounted on said second side is a compliant conductive element.

19. A high density packaging arrangement for electronics systems according to claim 16, wherein at least one of said plurality of first conductive means mounted on said first side and at least one of said plurality of second conducting means mounted on said second side are electrically interconnected.

20. A high density packaging arrangement for electronics systems according to claim 15, wherein at least one of said plurality of electronic components comprises:
   an electronic device encapsulated in a thermoplastic or thermoset material, except for lead portions thereof; and
   high thermal conductivity means, partially encapsulated in said thermoplastic material and having an exposed portion on a top surface of said electronic component, in thermal contact with said cooling means.

21. A high density packaging arrangement for electronics systems according to claim 15, wherein said cooling means is a plurality of cooling tubes.

22. A high density packaging arrangement for electronics systems according to claim 21, wherein at least one of said plurality of cooling tubes has a generally rectangular cross-section.

23. A high density packaging arrangement for electronics systems according to claim 15, wherein said coolant is a liquid.

24. A high density packaging arrangement for electronics systems according to claim 15, wherein said coolant is a gas.

25. A high density packaging arrangement for electronics systems according to claim 15, wherein said each circuit board assembly further comprises resilient means, positioned between at least one of said plurality of electronic components and said first side, biasing said electronic component toward said cooling means.

26. A high density packaging arrangement for electronic systems, comprising:

a first circuit board assembly, comprising an insulating circuit board having a plurality of electronic components mounted on a first side thereof and having conductor means interconnecting said electronic components; and a second circuit board assembly, comprising an insulating circuit board having a plurality of electronic components mounted on a first side thereof and having conductor means interconnecting said electronic components and having cooling means, mounted on a second side thereof, for passage of a coolant;

wherein said first and second circuit board assemblies are arranged such that said cooling means mounted on said second circuit board assembly is in heat conductive contact with at least one of said plurality of electronic components mounted on said first circuit board assembly.

* * * * *